United States Patent
Menchhofer et al.

(10) Patent No.: US 11,724,310 B2
(45) Date of Patent: Aug. 15, 2023

(54) TITANIUM-GROUP NANO-WHISKERS AND METHOD OF PRODUCTION

(71) Applicants: Consolidated Nuclear Security, LLC, Oak Ridge, TN (US); UT-Battelle, LLC, Oak Ridge, TN (US)

(72) Inventors: Paul A. Menchhofer, Clinton, TN (US); Roland D. Seals, Oak Ridge, TN (US); James O. Kiggans, Jr., Oak Ridge, TN (US)

(73) Assignees: Consolidated Nuclear Security, LLC, Oak Ridge, TN (US); UT-Battelle, LLC, Oak Ridge, TN (US)

(*) Notice: Subject to any disclaimer, the term of this patent is extended or adjusted under 35 U.S.C. 154(b) by 1190 days.

(21) Appl. No.: 15/883,416

(22) Filed: Jan. 30, 2018

(65) Prior Publication Data
US 2018/0154435 A1 Jun. 7, 2018

Related U.S. Application Data

(63) Continuation-in-part of application No. 13/162,866, filed on Jun. 17, 2011, now abandoned.

(51) Int. Cl.
| | |
|---|---|
| B22F 1/00 | (2022.01) |
| C23C 16/02 | (2006.01) |
| B22F 1/16 | (2022.01) |
| H01B 1/02 | (2006.01) |
| C23C 16/32 | (2006.01) |
| C22C 32/00 | (2006.01) |
| C01B 32/914 | (2017.01) |

(Continued)

(52) U.S. Cl.
CPC ............ *B22F 1/16* (2022.01); *C01B 32/914* (2017.08); *C01B 32/921* (2017.08); *C22C 32/0052* (2013.01); *C22C 47/00* (2013.01); *C22C 49/04* (2013.01); *C22C 49/14* (2013.01); *C23C 16/0218* (2013.01); *C23C 16/32* (2013.01); *C23C 16/4417* (2013.01); *C30B 25/005* (2013.01); *C30B 29/36* (2013.01); *C30B 29/62* (2013.01); *H01B 1/02* (2013.01); *B22F 1/054* (2022.01); *B22F 2301/205* (2013.01); *B22F 2302/10* (2013.01)

(58) Field of Classification Search
None
See application file for complete search history.

(56) References Cited

U.S. PATENT DOCUMENTS 6,652,967 B2 * 11/2003 Yadav .................... B01J 23/08
428/403

OTHER PUBLICATIONS

Pierson, Hugh O. "Handbook of Refractory Carbides and Nitrides—Properties, Characteristics, Processing, and Applications". Westwood, NJ: Noyes Publications, 1966. (Year: 1966).*

(Continued)

*Primary Examiner* — Scott R. Walshon
*Assistant Examiner* — Thomas A Mangohig
(74) *Attorney, Agent, or Firm* — Luedeka Neely Group, P.C.

(57) ABSTRACT

Disclosed herein are structures comprising a titanium, zirconium, or hafnium powder particle with titanium carbide, zirconium carbide, or hafnium carbide (respectively) nano-whiskers grown directly from and anchored to the powder particle. Also disclosed are methods for fabrication of such structures, involving heating the powder particles and exposing the particles to an organic gas.

20 Claims, 3 Drawing Sheets

(51) Int. Cl.
*C30B 29/62* (2006.01)
*C30B 25/00* (2006.01)
*C22C 47/00* (2006.01)
*C22C 49/14* (2006.01)
*C30B 29/36* (2006.01)
*C23C 16/44* (2006.01)
*C01B 32/921* (2017.01)
*C22C 49/04* (2006.01)
*B22F 1/054* (2022.01)

(56) References Cited

OTHER PUBLICATIONS

Talapatra, S., et al., Direct growth of aligned carbon nanotubes on bulk metals, Nature Nanotechnology, Nov. 2006, vol. 1, pp. 112-116.
Office Action for related family U.S. Appl. No. 16/786,286, dated Apr. 24, 2020, 7 pages and references cited therein.

* cited by examiner

TITANIUM-GROUP NANO-WHISKERS AND METHOD OF PRODUCTION

CROSS-REFERENCE TO RELATED APPLICATION

This application claims priority as a continuation-in-part to co-pending U.S. application Ser. No. 13/162,866 filed Jun. 17, 2011, and entitled "Titanium-Group Nano-whiskers and Method of Production," the entire contents being incorporated by reference herein.

GOVERNMENT RIGHTS

The U.S. Government has certain rights to this invention pursuant to contract number DE-NA0001942 between the U.S. Department of Energy and Consolidated Nuclear Security, LLC.

The U.S. Government has certain rights to this invention pursuant to Contract No. DE-AC05-00OR22725 between the U.S. Department of Energy and UT—Battelle, LLC.

FIELD

This disclosure relates to the field of transition metal carbides. More particularly, this disclosure relates to titanium-group nano-whiskers.

BACKGROUND

Transition metal carbides, including the NaCl-structured group IV carbides (titanium carbide, zirconium carbide, hafnium carbide, vanadium carbide, niobium carbide and tantalum carbide), have extremely high melting points and are therefore referred to collectively as "refractory carbides." In addition to their high temperature stabilities, these compounds typically exhibit high hardness and high thermal and electrical conductivity. The first three transition metals (Ti, Zr and Hf) are referred to herein as titanium-group metals and their corresponding carbides (TiC, ZrC, and HfC) are referred to herein as titanium-group carbides. The corresponding oxides ($Ti_mO_n$, $Zr_mO_n$, and $Hf_mO_n$) are referred to herein as titanium group oxides. These transition metals also produce oxycarbides ($TiO_xC_y$, $ZrO_xC_y$, and $HfO_xC_y$), which are referred to herein as titanium group oxycarbides.

Refractory carbides may be produced in different morphologies for various applications. For example, refractory carbides may be formed as particulates for use in grit-blasting applications, they may be hot-pressed to form cutting tools and high-temperature mechanical components such as turbine blades, and they may be formed as powders for use as additives to improve hardness in metal alloys and ceramic compositions. A particular refractory structure of interest is a whisker morphology. Whiskers are particularly useful for toughening metal matrix composite (MMC) materials and ceramic matrix composite (CMC) materials. Titanium carbide whiskers may be produced by a high temperature chemical reaction process:

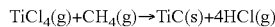

$TiCl_4(g) + CH_4(g) \rightarrow TiC(s) + 4HCl(g)$ where the (g)'s represents gas phases and the (s) represents a solid-phase material. Unfortunately, this process is expensive primarily because of the high temperatures required (1100-1200° C.). Also, controlling the morphology (e.g., the shape, size, aspect ratio, and smoothness) of the resultant whiskers is often difficult with this process. Consistency in these morphological properties is important for uniformly distributing stresses in MMC and CMC materials in which whiskers are dispersed in order to improve the toughness of the composite material. What are needed therefore are less expensive methods to produce more uniform refractory carbide whiskers.

SUMMARY

The present disclosure provides a titanium-group structure that typically includes a titanium-group powder particle and a plurality of titanium group nano-whiskers jointlessly extending from the titanium-group powder particle by being grown directly from the titanium-group powder particle. The titanium-group powder particle typically having a maximum dimension that is in a range from about one micron to about 500 microns, typically between 10 and 100 microns. The plurality of titanium group nano-whiskers typically having a tapered structure with a maximum diameter that is in a range from about one nanometer to about one hundred nanometers and have a length that is at least about one hundred nanometers.

Also provided is a method of forming titanium group nano-whiskers. The method typically involves disposing titanium-group powder particles in a furnace chamber and establishing a controlled environment within the chamber for the titanium-group powder particles. The titanium-group powder particles in the controlled environment are typically heated to a temperature that is in a temperature range from approximately 600° C.-650° C. The heated titanium-group powder particles are exposed to an organic gas for a duration of time that is in a time range from about one hour to about twenty-four hours, such that the titanium group nano-whiskers are grown directly from and anchored to the titanium-group powder particles.

BRIEF DESCRIPTION OF THE DRAWINGS

Various advantages are apparent by reference to the detailed description in conjunction with the figures, wherein elements are not to scale so as to more clearly show the details, wherein like reference numbers indicate like elements throughout the several views, and wherein.

DETAILED DESCRIPTION

Figure 1:
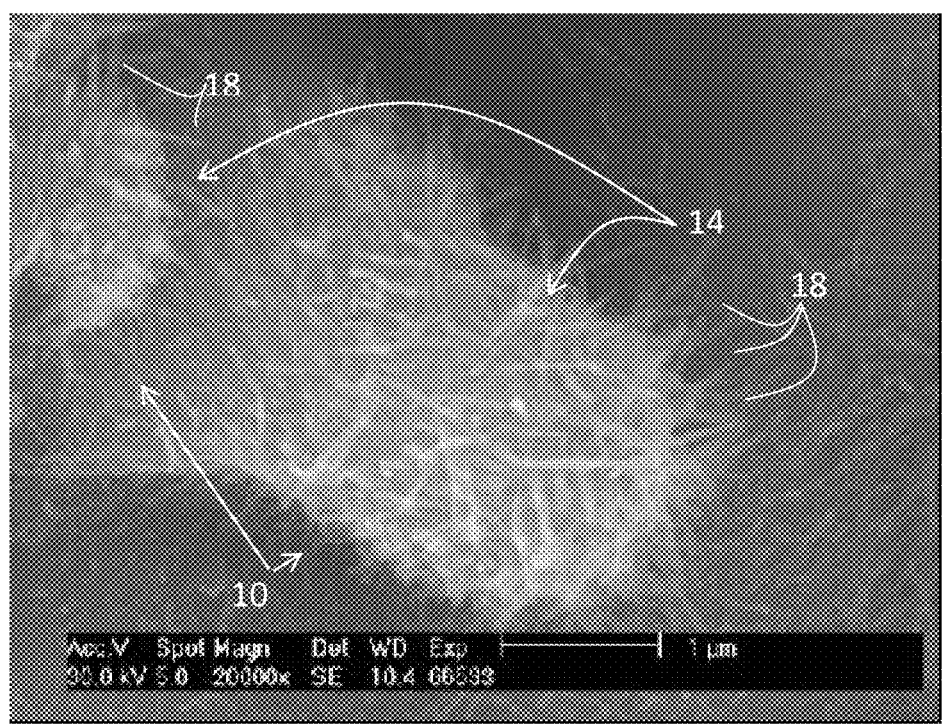
FIG. 1 is a photomicrograph of titanium powder particles with titanium carbide nano-whiskers anchored to the titanium powder particles.

In the following detailed description of the preferred and other embodiments, reference is made to the accompanying drawings, which form a part hereof, and within which are shown by way of illustration the practice of specific embodiments of refractory particulate structure and methods of forming refractory particulate structures. It is to be understood that other embodiments may be utilized, and that structural changes may be made and processes may vary in other embodiments.

Whiskers are crystalline structures that may be formed at nano-scale and/or micro-scale and/or milli-scale dimensions. "Nano-scale" refers to a dimension that is between approximately one Angstrom (0.1 nanometer) and approximately 100 nanometers (0.1 micrometer). "Micro-scale" generally refers to a dimension on the order of a micrometer and "milli-scale" generally refers to a dimension on the order of a milli-meter. However, in order to avoid discontinuities between various dimensional ranges used herein, the term "micro-scale" as used herein refers to a dimension that is between approximately 100 nanometers and 100 micrometers and as used herein the term "milli-scale" refers to a dimension that is between approximately 100 micrometers and 1 millimeter. Nano-, micro-, and milli-scale features may occur in one, two, or three dimensions. For example, a nano-film may be characterized by reference to only one dimension (i.e., its thickness), a nano-tube may be characterized by reference to two dimensions (its diameter and length), and a nano-particle may be characterized by reference to three dimensions (its length, width, and height). Whiskers (such as nano-whiskers) are typically characterized by reference to two dimensions, length and diameter. Whiskers (such as nano-whiskers) are often also characterized by reference to their aspect ratio (length:diameter). Typically, nano-whiskers have an aspect ratio of at least about four. For example, nano-whiskers typically have a diameter of about ten nanometers and a length of at least forty nanometers. However, certain types of nano-whiskers may have smaller diameters, much longer lengths, and an aspect ratio that is less than four or much more than four.

Whiskers (nano-whiskers, micro-whiskers and milli-whiskers) are used as reinforcing structures in materials to increase their strength and toughness. Whiskers provide strength and toughness through such effects as tensile strain resistance, crack deflection, and micro-crack bridging.

The titanium-group carbides, titanium-group oxides, and the titanium-group oxycarbides form nano-whiskers. Such nano-whiskers are referred to herein as titanium-group nano-whiskers. Thus, for example, titanium-group nano-whiskers may be formed as TiC nano-whiskers, or ZrC nano-whiskers, or HfC nano-whiskers, or $Ti_mO_n$ nano-whiskers, or $Zr_mO_n$ nano-whiskers, or $Hf_mO_n$ nano-whiskers, or $TiO_xO_y$ nano-whiskers, or $ZrO_xC_y$ nanowhiskers, or $HfO_xC_y$ nano-whiskers.

Titanium-group carbide nano-whiskers (i.e., TiC nano-whiskers or ZrC nano-whiskers or HfC nano-whiskers) are a particularly useful category of materials. Compared with SiC and $Si_3N_4$ nano-whiskers and compared with TiC micro-scale or TiC milli-scale whiskers, TiC nano-whiskers offer higher specific strength (especially at high temperatures), increased corrosion resistance, better thermal and electrical properties, and better compatibility with other materials. Titanium-group carbide nano-whiskers may be used to form composite materials that have a high melting point, high hardness, excellent abrasion resistance, good creep resistance, good corrosion resistance, good thermal conductivity, and high thermal shock resistance. These materials have applications in mechanical industries for dies and tooling requiring a high hardness, for cutting tools, for grinding wheels, for coated cutting tips, for coated steel tools. These materials also have application in automotive, aerospace, chemical, and electronics industries. Military applications include uses in graded armor material for ballistic shielding.

Disclosed herein are titanium group nano-whiskers that are anchored to titanium-group powder particles, and methods for their fabrication. For purposes of the present disclosure, the phrase "titanium-group powder particles" refers to powder particles formed from one or more of the titanium-group metals. For purposes of the present disclosure, the term "anchored" refers to the jointless relationship between the titanium-group powder particles and the titanium-group nano-whiskers resulting from the nano-whiskers being grown directly from the powder particles as provided below. FIG. 1 illustrates such a material, a Ti/TiX structure. As used herein the notation "E/EX" refers to a structure having powder particles comprising element "E" (where "E" is Ti, Zr, Hf or any combination thereof) with type "EX" nano-whiskers anchored to the "E" powder particles, where X is a carbide (C), or an oxide ($O_n$) or an oxycarbide ($O_xC_y$) Thus, for example, a Ti/TiX structure refers to a titanium particle with TiC or $Ti_mO_n$ or $TiO_xO_y$ nanoparticles anchored to the titanium particle.

Depicted as an example in FIG. 1 are two Ti/TiC structures 10. The Ti/TiC structures each include a Ti powder particle 14. Although the complete extent of each of the Ti powder particles 14 is not visible in FIG. 1, each titanium powder particle 14 preferably has a maximum dimension that is about five microns. In various other embodiments, a titanium-group powder particle has a maximum dimension that is in a range from about one micron to about 500 microns, typically between 10 and 100 microns.

Each Ti powder particle 14 has a plurality of TiC nano-whiskers 18 anchored to the Ti powder particle 14. In the embodiment of FIG. 1, the TiC nano-whiskers 18 have a facet structure typical of a face-centered cubic crystalline structure that is elongated along one direction, with a tip. The TiC nano-whiskers 18 are examples of tapered structures. As used herein the term "tapered" refers to a shape that has a base end (that is anchored to the powder particle) and a pointed tip end. The diameter of a "tapered" structure is fairly uniform along its length near the base end and for most of its length (typical of the crystalline face-centered cubic structure elongated along one crystallographic direction), but the diameter decreases toward the tip end (typical of the crystalline tip). In the embodiment of FIG. 1, the TiC nano-whiskers have a maximum diameter of about ten nanometers and a length that is in a range from about five hundred nanometers to about one thousand nanometers (one micron). In various other embodiments a titanium group nano-whisker is a tapered structure typically having a maximum diameter that is in a range from about one nanometer to about one hundred nanometers and typically having a length that is at least about one hundred nanometers.

Figure 2:
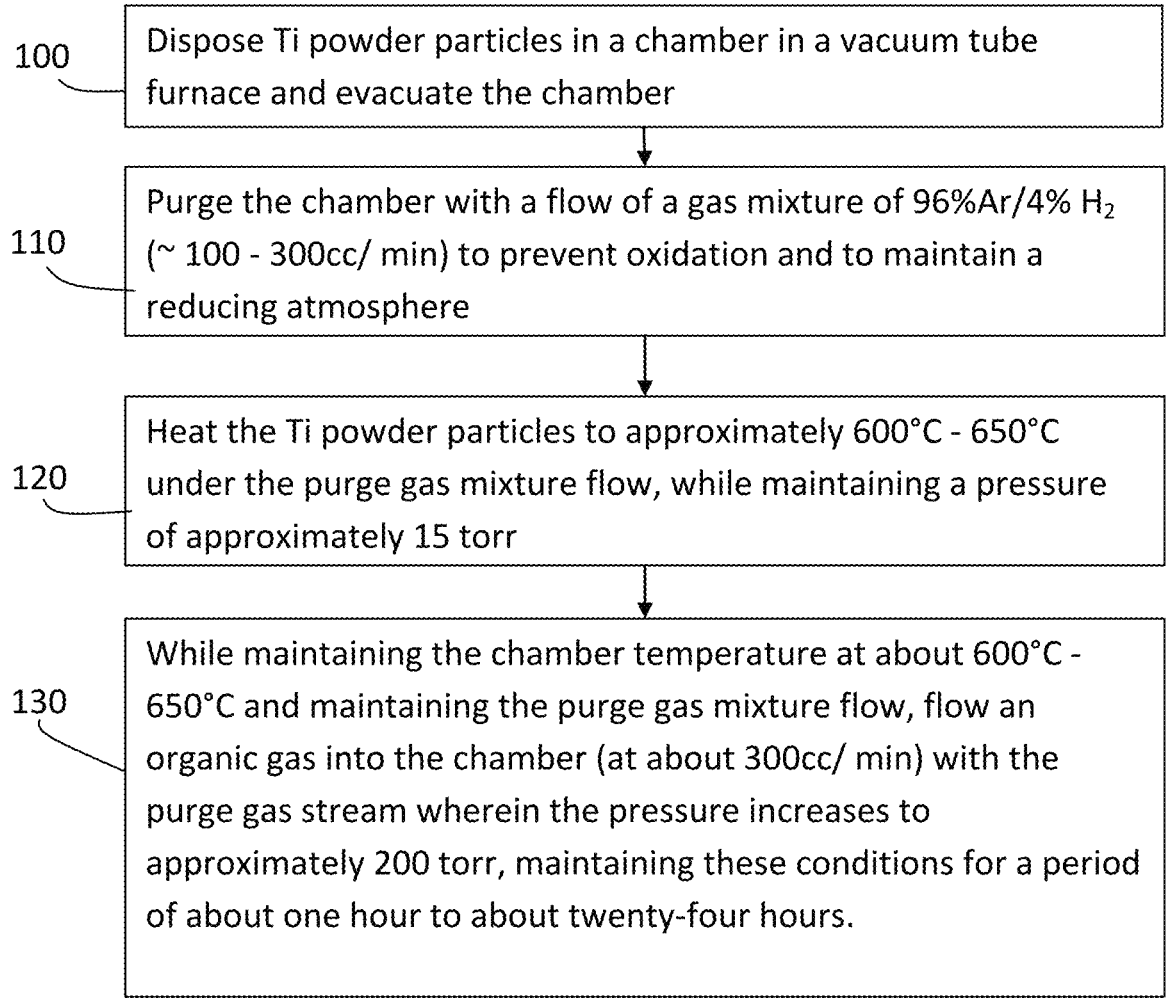
FIG. 2 is a process diagram for producing titanium powder particles with titanium carbide nano-whiskers anchored to the titanium powder particles.

FIG. 2 illustrates a process for making the Ti/TiC particulate structure. In Step 100, titanium powder particles are placed in a chamber of a vacuum furnace, such as a tube furnace, and the chamber is evacuated. A preferable form of titanium powder particles is a form "CP" (commercially pure) that is produced by International Titanium Powder LLC, Lockport, Ill., USA, according to the "Armstrong method." The Armstrong method appears to be disclosed (for example) in U.S. Pat. Nos. 5,779,761, and 5,958,106 and 6,409,797 and 6,861,038 and 7,351,272, and 7,435,282.

In Step 110, the chamber is purged with a mixture of inert and reducing gases (such as a mixture of 96% Ar/4% $H_2$) at a flow rate of about 100-300 cc/min to prevent oxidation of the titanium powder particles and to maintain a reducing atmosphere. A mixture of 96% Ar/4% $H_2$ is an example of one embodiment of a protective reducing environment. The term "protective reducing environment" is used herein to refer to an environment that protects against oxidation and maintains a reducing atmosphere. A gas environment that includes substantially only argon and hydrogen is an example of a protective reducing environment. The term "inert environment" is used herein to refer to an environment that contains only inert gas with no oxidizing or reducing gas. A gas environment that includes substantially only argon is an example of an inert environment.

The term "controlled environment" is used herein to refer to an environment that is established either as a protective reducing environment or as an inert environment. The relationships of these different environments are summarized in Table 1.

TABLE 1

| Controlled Environment | Protective Reducing Environment | e.g., Inert gas + hydrogen |
|---|---|---|
| | Inert Environment | e.g., Inert gas only |

Returning to FIG. 2, in Step 120, the titanium powder particles are heated to about 600° C.-650° C. (a process that typically takes about 30 minutes) while maintaining the purge gas flow and maintaining a pressure of approximately 15 torr in the chamber. It is beneficial that the chamber environment be purged to remove oxygen and moisture to prevent oxidation and to maintain a reducing atmosphere. Thus, the process typically starts by purging, then the pressure is set to about (or below) 15 torr, then the chamber is heated from room temperature to about 600° C.-650° C. The ramp time to heat to 650° C. and the time at 650° C. before the organic gas flow is started is not critical.

In Step 130, after the chamber has reached a temperature of about 600° C.-650° C., an organic gas (typically vaporized ethanol) is flowed into the chamber at a rate of about 300 cc/min, while maintaining the chamber temperature at about 600° C.-650° C. and maintaining the purge gas mixture flow, wherein the pressure in the chamber increases to approximately 200 torr. As recognized by persons skilled in the art, ethanol is an example of an alcohol and alcohols are examples of organic compounds. In the embodiment of FIG. 2, ethanol is used to "grow" titanium carbide whiskers from titanium powder particles. In other embodiments other alcohols may be vaporized or other organic gases may be substituted for the vaporized ethanol. For example, methane, propane, or butane may be used, as well as alkanes, cycloalkanes, alkenes, alkynes, aromatics, or terpenes. Ethanol is a preferred organic compound for Step 130 because it is inexpensive and it does not contain extraneous molecular branches that might interfere with the chemical processing. Step 130 is performed for a period of time that is typically in a range from about one hour to one day. During Step 130, TiC nano-whiskers grow directly from the Ti powder particles. Applying Step 130 for longer durations typically produces longer nano-whiskers than applying Step 130 for shorter durations.

The process steps of FIG. 2 (and steps of other process embodiments disclosed here) may be performed with zirconium powder particles being substituted for titanium powder particles to form a Zr/ZrC structure comprising ZrC nano-whiskers anchored to the zirconium powder particles. The process steps of FIG. 2 (and steps of other process embodiments disclosed here) may be performed with hafnium powder particles being substituted for titanium powder particles to form a Hf/HfC structure comprising HfC nano-whiskers anchored to the hafnium powder particles. According to other embodiments of the disclosure, the process steps of FIG. 2 (and steps of other process embodiments disclosed here) may also be performed with powder particles formed from any combination of titanium, zirconium, and hafnium to form corresponding combination structures. It should also be noted that in the process steps of FIG. 2 (and steps of other process embodiments disclosed here) a different inert gas (such as helium) may be substituted for argon.

As noted above, during step 130, the organic gas is used to "grow" titanium-group nano-whiskers from the titanium-group powder particles. The whiskers are grown directly from the titanium-group powder particles because the powder particles are themselves a source of titanium, zirconium, and/or hafnium that reacts with the organic gas to grow the whiskers from the powder particles. As not all of the titanium-group powder particles are consumed during the growth process, the remaining portion of the powder particles provide the support/substrate for the resulting titanium-group nano-whiskers grown from the powder particles. In other words, the titanium-group powder particles of the present disclosure provide both (a) the support/substrate for the titanium-group nano-whiskers; and (b) a catalyst in the growth process in that the powder particles themselves are a source of titanium, zirconium, or hafnium from which to grow the whiskers. In contrast, prior art processes typically grow nanostructures from catalyst nanoparticles that are merely attached or adhered to a non-catalytic substrate.

As a result of the titanium-group nano-whiskers being grown directly from the titanium-group powder particles (i.e., the whiskers being the result of a chemical reaction of the powder particles and the organic vapor resulting in whiskers growing/extending directly from the powder particles), the resulting nano-whiskers are a jointless extension of the titanium-group powder particle. This jointless (i.e., integrated, unitary, seamless, etc.) structure is highly beneficial in many circumstances because it provides a stronger structural relationship between the whiskers and the substrate than can be accomplished when whiskers are adhered or otherwise attached to a substrate via intervening catalyst particles. Put simply, there is no interface between the powder particles and the nano-whiskers produced according to the present disclosure that would weaken the structural relationship between the powder particles and the nano-whiskers when the nano-whiskers are grown directly and seamlessly from the powder particles. Additionally, growing the nano-whiskers directly from the powder particles assists in preventing crack formation and in providing a greater ability to control the grain structure in the nano-whiskers.

According to another aspect of the disclosure, and using titanium as an example, processing parameters such as the purge gas flow rate, initial pressure, organic gas flow rate (as well as the type of organic gas), temperature, and the purge gas composition affect the preferential formation of TiC (where Ti is $^{+2}$), $TiO_2$ (where Ti is $^{+4}$), or TiOC (where Ti is $^{+4}$). For example, the preferential formation of a particular product species is highly affected by the partial pressure of oxygen in the reaction chamber. If the oxygen levels are "zero" a preponderance of TiC will preferentially form. If the oxygen levels are low (but not zero) oxides or oxycarbides may be formed by consumption of the oxygen while at the same time some growth of TiC may occur. Then on the opposite end of the continuum, an abundance of oxygen favors a preponderance of $TiO_2$ growth. As further example, if an inert environment is employed (such as argon without any $H_2$) the atmosphere is not reducing, and then if $C_xH_yO_z$ is used as the organic gas the formation of $H_2O$ is possible, which acts as an oxidizer. Even when a protective reducing environment is used, oxidation may still occur to produce some $Ti^{+2}$ and $Ti^{+4}$ states. For example, Ti may be reduced when the oxidized species gains electrons to go to Ti(0); then oxidation occurs, losing electrons so that the titanium goes to an oxidation state of $^{+2}$ or $^{+4}$. Furthermore, these chemical reactions typically do not just go in one direction all of the time. So in a particular process it is possible to produce both TiC and some $TiO_2$ or even TiC and $TiO_2$, and TiOC.

However, conditions may be controlled as indicated herein to preferentially produce a specific chemical species.

Applications of Ti/TiX (or Zr/ZrX or Hf/HfX) structures include uses as reinforcing material in metal matrix and ceramic matrix composite materials to increase strength and toughness of such composite materials, as well as uses in other previously-described applications of titanium group nano-whiskers. For example, TiC nano-whiskers anchored to titanium powder particles may be used in hot pressing processes or casting processes to form metal matrix composites such as Ti—TiC and Fe—TiC. Ti/TiC (or Zr/ZrC or Hf/HfC) structures may also be used in hot pressing or molding or slip-casting processes to form ceramic matrix composites. In ceramic matrix composites, the main effect of the incorporation of the Ti/TiC (or Zr/ZrC or Hf/HfC) structures is a toughening of an otherwise brittle ceramic matrix. This toughening is enhanced (compared with many other ceramic toughening processes) because of the substantially uniform size, the substantially uniform morphology, the wide-ranging material compatibility, and the favorable interfacial bonding properties of these structures.

Ti/TiC (or Zr/ZrC or Hf/HfC) structures may also be combined with in-situ formed carbon nano-tubes, such as the carbon nano-tubes anchored to metal powders that are described in U.S. patent application Ser. No. 12/704,564—"COMPOSITE MATERIALS FORMED WITH ANCHORED NANOSTRUCTURES," filed Feb. 12, 2010, which issued as U.S. Pat. No. 8,974,719 on Mar. 10, 2015. U.S. patent application Ser. No. 12/704,564 is incorporated by reference in its entirety herein. For example, CNTs anchored to Fe powder particles may be blended with TiC nano-whiskers anchored to Ti powder particles and the combination may then be formed into metal matrix composites or ceramic matrix composites, by using methods for forming a nano-structure composite material described in U.S. patent application Ser. No. 12/704,564.

Example

Titanium carbide whiskers were grown from titanium powder particles using the parameters indicated in Table 2. Ranges of values indicate variations in different test runs.

TABLE 2

| Parameter | Baseline | Alternate 1 | Alternate 2 | Alternate 3 |
|---|---|---|---|---|
| Gas Purge | 96% Ar- 4% H2 | 98% Ar- 2% H2 | (93%-99%)AR- (7-1%)H2 | 100% Ar |
| Purge Gas Flow rate (cc/min) | 100-300 | 100-5000 | 100-5000 | 100-5000 |
| Initial Heatup T (deg. C.) | 650 | 500 | 500 | 500 |
| Initial P (torr) | 15 | 15 | 15 | 15 |
| Operating T (deg. C.) | 650 | 500-1000 | 500-1000 | 500-1000 |
| Reactive Organic Flow Rate (cc/min) | 300 | 100-1000 | 100-1000 | 100-1000 |
| Operating P (torr) | 200 | 1-300 | 1-300 | 1-300 |
| Operating time (hr) | 1-24 | 1-24 | 1-24 | 1-24 |

Titanium readily adsorbs hydrogen and may chemically react with hydrogen over a wide range of temperatures and pressures. However, Ti reacts much more readily with carbon than with hydrogen, which is important for the formation and growth of TiC nano-whiskers in the presence of hydrogen. Nonetheless, the process conditions of "Alternate 3" of Table 2 are advantageous since a controlled environment without hydrogen is provided.

Figure 3:
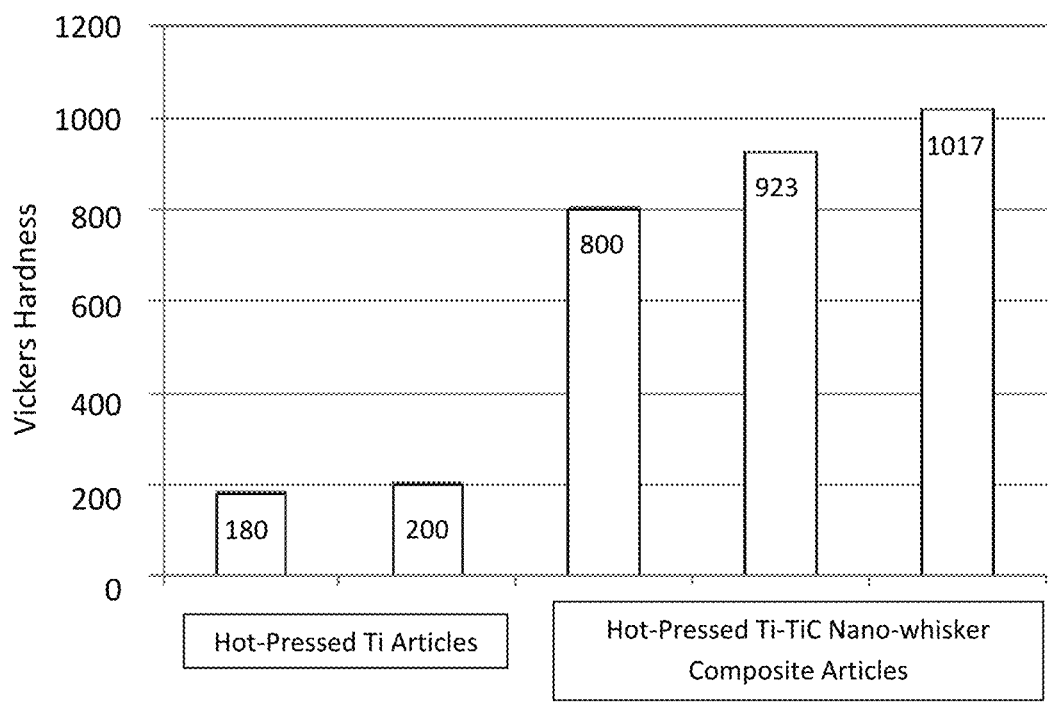
FIG. 3 is a graph showing Vickers hardness of two hot pressed titanium articles and three hot pressed TI-TiC nano-whisker composite articles.

The titanium carbide whiskers grown directly from titanium powder particles produced by process conditions indicated in Table 2 were hot-pressed into composite structures and tested for hardness compared with standard hot-pressed Ti particle samples. Typical results are depicted in FIG. 3. The standard hot-pressed Ti particle samples had a Vickers hardness that ranged from about 180 to about 200 $kgf/mm^2$. Ti powder particles with anchored TiC nano-whiskers were fabricated according to the present disclosure. The Ti powder particles with anchored TiC nano-whiskers were hot pressed to form Ti—TiC composite test samples. The hot-pressed Ti—TiC composite test samples had a generally consistent Vickers hardness of ~800-1000 $kgf/mm^2$. That is, a five-fold increase in hardness was observed for hot-pressed samples fabricated using Ti powder particles with anchored nano-whiskers compared with hot-pressed samples fabricated from Ti powder particles alone.

[Note: The Vickers hardness is the quotient obtained by dividing the kgf load by the square mm area of indentation ($kgf/mm^2$). Vickers hardness values are generally independent of the test force; that is, they will come out the same for 500 gf and 50 kgf, as long as the force is at least 200 gf. Therefore, the values are reported with units of $kgf/mm^2$ or without units.]

In summary, embodiments disclosed herein provide comparatively low-cost titanium-based nano-whiskers having substantially uniform morphology. These materials have numerous applications because of improved properties such as increased strength, increased hardness, very high melting points, and superior chemical stability at high temperature.

The foregoing descriptions of embodiments have been presented for purposes of illustration and exposition. They are not intended to be exhaustive or to limit the embodiments to the precise forms disclosed. Obvious modifications or variations are possible in light of the above teachings. The embodiments are chosen and described in an effort to provide the best illustrations of principles and practical applications, and to thereby enable one of ordinary skill in the art to utilize the various embodiments as described and with various modifications as are suited to the particular use contemplated. All such modifications and variations are within the scope of the appended claims when interpreted in accordance with the breadth to which they are fairly, legally, and equitably entitled.

What is claimed is:

1. A titanium-group structure comprising:
   a titanium-group powder particle having a plurality of titanium-group nano-whiskers jointlessly extending from the titanium-group powder particle by being grown directly from the titanium-group powder particle.

2. The titanium-group structure of claim 1 wherein the titanium-group powder particle has a maximum dimension of about 500 microns and the plurality of titanium group nano-whiskers have a maximum diameter of about one hundred nanometers and a length that is at least about one hundred nanometers.

3. The titanium-group structure of claim 1 wherein the titanium-group powder particle comprises titanium and the plurality of titanium group nano-whiskers comprise titanium carbide.

4. The titanium-group structure of claim 1 wherein the titanium-group powder particle comprises zirconium and the plurality of titanium-group nano-whiskers comprise zirconium carbide.

5. The titanium-group structure of claim 1 wherein the titanium-group powder particle comprises hafnium and the plurality of titanium-group nano-whiskers comprise hafnium carbide.

6. The titanium-group structure of claim 1 wherein the titanium-group powder particle comprises any combination of titanium, zirconium, and hafnium.

7. The titanium-group structure of claim 6 wherein the titanium group nano-whiskers comprise any combination of titanium carbide, zirconium carbide, and hafnium carbide.

8. The titanium-group structure of claim 1 wherein the plurality of titanium-group nano-whiskers each have a tapered structure.

9. The titanium-group structure of claim 1 wherein the titanium-group powder particle has a dimension that is at least one micron.

10. The titanium-group structure of claim 1 wherein the plurality of titanium-group nano-whiskers each have a maximum diameter of about ten nanometers and a length that is in a range from about five hundred nanometers to about one thousand nanometers.

11. The titanium-group structure of claim 1 wherein the plurality of titanium-group nano-whiskers include face-centered cubic crystalline titanium-group nano-whiskers.

12. A titanium-group structure consisting of a titanium-group powder particle having a plurality of titanium-group nano-whiskers jointlessly extending from the titanium-group powder particle.

13. The titanium-group structure of claim 12 wherein the titanium-group powder particle has a maximum dimension of about 500 microns and the plurality of titanium group nano-whiskers have a maximum diameter of about one hundred nanometers and a length that is at least about one hundred nanometers.

14. The titanium-group structure of claim 12 wherein the titanium-group powder particle comprises titanium and the plurality of titanium group nano-whiskers comprise titanium carbide.

15. The titanium-group structure of claim 12 wherein the titanium-group powder particle comprises zirconium and the plurality of titanium-group nano-whiskers comprise zirconium carbide.

16. The titanium-group structure of claim 12 wherein the titanium-group powder particle comprises hafnium and the plurality of titanium-group nano-whiskers comprise hafnium carbide.

17. The titanium-group structure of claim 12 wherein the titanium-group powder particle comprises any combination of titanium, zirconium, and hafnium and the titanium group nano-whiskers comprise any combination of titanium carbide, zirconium carbide, and hafnium carbide.

18. The titanium-group structure of claim 12 wherein the plurality of titanium-group nano-whiskers each have a tapered structure.

19. The titanium-group structure of claim 12 wherein the titanium-group powder particle has a dimension that is at least one micron.

20. The titanium-group structure of claim 12 wherein the plurality of titanium-group nano-whiskers each have a maximum diameter of about ten nanometers and a length that is in a range from about five hundred nanometers to about one thousand nanometers.

* * * * *